United States Patent
Yamamoto et al.

(10) Patent No.: US 9,812,947 B2
(45) Date of Patent: Nov. 7, 2017

(54) MOTOR CONTROL DEVICE HAVING LIFE PREDICTION UNIT OF SMOOTHING CAPACITOR

(71) Applicant: FANUC CORPORATION, Yamanashi (JP)

(72) Inventors: Kenta Yamamoto, Yamanashi (JP); Tadashi Okita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/078,078

(22) Filed: Mar. 23, 2016

(65) Prior Publication Data

US 2016/0315575 A1   Oct. 27, 2016

(30) Foreign Application Priority Data

Apr. 27, 2015   (JP) ................... 2015-090832

(51) Int. Cl.
  *G01R 23/09*   (2006.01)
  *H02M 1/32*   (2007.01)
  (Continued)

(52) U.S. Cl.
  CPC .............. *H02M 1/32* (2013.01); *G01R 31/00* (2013.01); *H02M 5/4585* (2013.01); *H02P 27/06* (2013.01)

(58) Field of Classification Search
  CPC ....... H02M 1/32; H02M 5/4585; H02P 27/06; G01R 31/00
  (Continued)

(56) References Cited

U.S. PATENT DOCUMENTS

| 4,373,177 A | * | 2/1983 | Finkelstein | ............ | H01G 9/022 |
| | | | | | 252/62.2 |
| 4,479,166 A | * | 10/1984 | Finkelstein | ............ | H01G 9/022 |
| | | | | | 252/62.2 |

(Continued)

FOREIGN PATENT DOCUMENTS

| JP | 5308701 A | 11/1993 |
| JP | 880055 A | 3/1996 |

(Continued)

OTHER PUBLICATIONS

English Abstract for Japanese Publication No. 08-080055 A, dated Mar. 22, 1996, 1 pg.

(Continued)

*Primary Examiner* — Rita Leykin
(74) *Attorney, Agent, or Firm* — Fredrikson & Byron, P.A.

(57) ABSTRACT

A motor control device includes a converter that converts AC power into DC power, a smoothing capacitor provided in a DC link, an inverter that converts the DC power in the DC link into AC power for a motor, a capacitor capacity measurement unit that measures a capacity of the smoothing capacitor, a data record unit that records a plurality of pieces of data composed of a measurement value of the capacity of the smoothing capacitor and a date or both a date and time when the measurement has been performed, a deterioration characteristic calculation unit that calculates a deterioration characteristic line indicating a change of the capacity of the smoothing capacitor with respect to elapsed time, on the basis of the recorded data, and a life prediction unit that predicts a period when a life of the smoothing capacitor ends, on the basis of the deterioration characteristic line.

5 Claims, 4 Drawing Sheets

(51) Int. Cl.
*G01R 31/00* (2006.01)
*H02P 27/06* (2006.01)
*H02M 5/458* (2006.01)

(58) Field of Classification Search
USPC ........ 318/490; 73/335.04, 862.337, 862.626;
361/152, 155, 156, 181, 251, 268, 270,
361/271, 433, 16, 17, 18; 323/242, 288,
323/370; 324/382, 427, 519, 750.17, 548,
324/658, 661, 686, 76.66
See application file for complete search history.

(56) References Cited

U.S. PATENT DOCUMENTS

| | | | | | |
|---|---|---|---|---|---|
| 7,148,697 | B2* | 12/2006 | Doljack | ............ | G01R 27/2605 324/548 |
| 7,388,362 | B2* | 6/2008 | Yurgil | ............ | H01G 9/155 324/658 |
| 7,487,391 | B2* | 2/2009 | Pecone | ............ | G06F 1/28 714/14 |
| 7,565,267 | B2* | 7/2009 | Warizaya | ............ | G06F 11/008 340/635 |
| 7,622,898 | B2* | 11/2009 | Shimizu | ............ | H02J 7/0016 320/166 |
| 7,876,549 | B2* | 1/2011 | Umemoto | ............ | H01G 9/0032 29/25.03 |
| 7,898,263 | B2* | 3/2011 | Ishida | ............ | H02J 7/1461 320/132 |
| 8,194,367 | B2* | 6/2012 | Oshida | ............ | B60L 3/003 361/18 |
| 8,436,590 | B2* | 5/2013 | Funaba | ............ | B60K 6/445 307/109 |
| 8,521,459 | B2* | 8/2013 | Watanabe | ............ | G01R 31/3679 702/65 |
| 8,674,664 | B2* | 3/2014 | Takizawa | ............ | B60L 11/1816 320/132 |
| 8,686,694 | B2* | 4/2014 | Funaba | ............ | B60K 6/445 307/109 |
| 8,975,897 | B2* | 3/2015 | Yoshioka | ............ | G01R 31/3651 320/132 |
| 9,106,104 | B2* | 8/2015 | Kinjo | ............ | H02J 3/32 |
| 9,461,347 | B2* | 10/2016 | Kise | ............ | H01M 4/131 |
| 2007/0080905 | A1* | 4/2007 | Takahara | ............ | G09G 3/3233 345/76 |
| 2010/0295375 | A1* | 11/2010 | Oshida | ............ | B60L 3/003 307/66 |
| 2012/0221891 | A1* | 8/2012 | Shimizu | ............ | G06F 11/1441 714/15 |
| 2013/0214745 | A1* | 8/2013 | Funaba | ............ | B60K 6/445 320/166 |
| 2014/0111145 | A1* | 4/2014 | Mitsuda | ............ | B60L 11/14 320/107 |
| 2014/0159755 | A1* | 6/2014 | Sumi | ............ | G01R 31/14 324/750.01 |
| 2014/0372050 | A1* | 12/2014 | Kanda | ............ | G01R 31/028 702/57 |
| 2016/0356856 | A1* | 12/2016 | Hongo | ............ | G01R 31/3634 |
| 2016/0377670 | A1* | 12/2016 | Tamida | ............ | G01R 27/025 324/551 |

FOREIGN PATENT DOCUMENTS

| | | |
|---|---|---|
| JP | 2007318872 A | 12/2007 |
| JP | 2009192308 A | 8/2009 |
| JP | 201043959 A | 2/2010 |

OTHER PUBLICATIONS

English Abstract for Japanese Publication No. 2007-318872 A, dated Dec. 6, 2007, 2 pgs.
English Abstract and Machine Translation for Japanese Publication No. 2010-043959 A, dated Feb. 25, 2010, 19 pgs.
English Abstract and Machine Translation for Japanese Publication No. 2009-192308 A, dated Aug. 27, 2009, 15 pgs.
English Abstract and Machine Translation for Japanese Publication No. 05-308701 A, dated Nov. 19, 1993, 6 pgs.

* cited by examiner

MOTOR CONTROL DEVICE HAVING LIFE PREDICTION UNIT OF SMOOTHING CAPACITOR

BACKGROUND OF THE INVENTION

1. Field of the Invention

The present invention relates to a motor control device that converts AC power supplied from a three-phase AC input side into DC power and outputs the DC power to a DC link, and then converts the DC power into AC power for driving a motor and supplies the AC power to the motor, and in particular, relates to a motor control device having a life prediction unit for predicting a life of a smoothing capacitor provided in a DC link.

2. Description of the Related Art

In motor control devices that drive motors in working machines, industrial machines, forging press machines, injection molding machines, or various robots, AC power inputted from a side of an AC power source is converted into DC power by a converter, and then, the DC power is converted into AC power by an inverter, and the AC power is used as driving power of a motor.

FIG. 4 is a diagram illustrating a configuration of a general motor control device. A motor control device 100 includes a converter 101 that converts AC power from a commercial three-phase AC power source (hereinafter, referred to as just "AC power source") 103 into DC power and an inverter 102 that converts the DC power outputted from the converter 101 into AC power having a desired frequency, which is to be supplied as driving power of a motor 104, or converts AC power regenerated from the motor 104 into DC power, and controls the speed, the torque, or the position of a rotator of the motor 104 connected to an AC side of the inverter 102. The converter 101 and the inverter 102 are connected via a DC link. In the DC link, a smoothing capacitor (DC link capacitor) 105 is provided for smoothing the DC output of the converter 101. In general, when there are multiple driving axes (feed axes and main axes), multiple motors are also provided for driving the respective driving axes. The same number of the inverters as the number of the motors are connected in parallel so as to separately supply driving power to each motor provided corresponding to each of the multiple driving axes and drive-control the motor. On the other hand, in many cases, one converter is provided with respect to the multiple inverters for the purpose of reducing cost and space of occupancy of the motor control device. Note that for simplifying the drawing, FIG. 4 depicts a single motor 104, and therefore the number of inverters 102 is one.

It is generally known that a smoothing capacitor provided in a DC link between a converter and an inverter is a part having a finite life whose electric capacity (hereinafter, referred to as just "capacity") is reduced due to repetition of charge and discharge. When the smoothing capacitor deteriorates due to the repetition of charge and discharge and the capacity is reduced, a problem in that a ripple current flowing in the DC link increases and the fluctuation of a DC voltage is large occurs.

In addition, there are some motor control devices that reduce supply power from an AC power source to reduce the power-supply system capacity by using energy stored in a smoothing capacitor when accelerating a motor. In this case, when the smoothing capacitor deteriorates due to repetition of charge and discharge and the capacity is reduced, energy that can be stored is reduced and sufficient energy cannot be supplied during acceleration of the motor, and some type of failure may occur in a working step in the case of a working machine, for example.

Therefore, in order to replace a smoothing capacitor whose life ends at an optimal period, it is important to accurately know the capacity of the smoothing capacitor and to predict when the life will end.

For example, as described in Japanese Unexamined Patent Publication No. 8-80055, there is a method for determining a life of an electrolytic capacitor from a situation of a voltage reduction of the electrolytic capacitor provided in a DC link during power-off of an inverter.

In addition, for example, as described in Japanese Unexamined Patent Publication No. 2007-318872, there is a method for predicting a life of an electrolytic capacitor from a situation of an increase of a leakage current of the electrolytic capacitor provided in a DC link.

As described above, when a smoothing capacitor provided in a DC link between a converter and an inverter in a motor control device deteriorates due to repetition of charge and discharge and the capacity is reduced, there is a problem in that a ripple current flowing in the DC link increases and the fluctuation of a DC voltage is large. In addition, depending on the type of a motor control device, there is a motor control device that reduces supply power from an AC power source to reduce the power-supply system capacity by using energy stored in a smoothing capacitor when accelerating a motor. However, when the capacity of the smoothing capacitor is reduced, there is a problem in that energy that can be stored is reduced and sufficient energy cannot be supplied when accelerating the motor. When the capacity of the smoothing capacitor cannot be accurately predicted, the timing to replace the smoothing capacitor is missed, and the large ripple current and DC voltage fluctuation may be generated in the DC link. Alternatively, it is uneconomical because the smoothing capacitor, which has not yet reached the end of its life, may be replaced unnecessarily early. Therefore, it is important to know the capacity of the smoothing capacitor in order to accurately predict the life of the smoothing capacitor may end.

For example, according to the invention described in Japanese Unexamined Patent Publication No. 8-80055, the life of the electrolytic capacitor at a point when detecting the voltage reduction of the electrolytic capacitor provided in the DC link during power-off of the inverter can be determined, but when the life ends in the future cannot be predicted. Thus, it is impossible to make a flexible response, for example, to review an operating condition of the motor control device, on the basis of the life prediction of the electrolytic capacitor. Furthermore, it is impossible to create an efficient replacement plan of the electrolytic capacitor for the life of the electrolytic capacitor, which ends in the future. In addition, in the invention described in Japanese Unexamined Patent Publication No. 8-80055, the capacity of the electrolytic capacitor is measured during discharge, and thus, a discharge unit for this purpose is needed separately.

In addition, the invention described in Japanese Unexamined Patent Publication No. 2007-318872 is to predict the life of the electrolytic capacitor, on the basis of an experimental result in which the life ends on the third or fourth day after shifting into an increasing tendency of the leakage current. In other words, the end of the life can be predicted first just before the electrolytic capacitor completely fails, but the life that ends after a mid-and-long period (for example, in a few months or a few years) cannot be predicted. If the life that ends after a mid-and-long period can be grasped, it is possible to make a response, for example, to change an operating condition of the motor control device to one that prevents the electrolytic capacitor from deteriorating as much as possible with plenty of time until the life ends, and the deterioration prevention effect is also high. However, the life prediction in the near future, such as after three or four days, is not very effective in preventing deterioration even if the operating condition of the motor control device is changed to one that prevents the electrolytic capacitor from deteriorating as much as possible. In addition, in the invention described in Japanese Unexamined Patent Publication No. 2007-318872, the leakage current of the electrolytic capacitor is measured, and thus, a leakage current measurement unit for this purpose is needed separately.

SUMMARY OF INVENTION

In view of the above-described problems, it is an object of the present invention to provide a motor control device capable of accurately predicting a life of a smoothing capacitor in a DC link between a converter and an inverter.

In order to achieve the above-described object, a motor control device includes a converter that converts AC power supplied from a side of an AC power source into DC power, a smoothing capacitor provided in a DC link on a DC side of the converter, an inverter that performs mutual power conversion between the DC power in the DC link and AC power that is driving power or regenerative power of a motor, a capacitor capacity measurement unit that measures a capacity of the smoothing capacitor, a data record unit that records a plurality of pieces of data composed of a measurement value of the capacity of the smoothing capacitor measured by the capacitor capacity measurement unit and a date or both a date and time when the measurement has been performed, a deterioration characteristic calculation unit that calculates a deterioration characteristic line indicating a change of the capacity of the smoothing capacitor with respect to elapsed time, on the basis of the plurality of pieces of data recorded in the data record unit, and a life prediction unit that predicts a period when a life of the smoothing capacitor ends, on the basis of the deterioration characteristic line calculated by the deterioration characteristic calculation unit.

The life prediction unit may calculate a date or both a date and time when the deterioration characteristic line is a predetermined deterioration determination level or less, and determine the date or both the date and time as the period when the life of the smoothing capacitor ends.

In addition, the deterioration characteristic calculation unit may calculate the deterioration characteristic line as an n-th degree function expression, where n is a natural number, on the basis of the plurality of pieces of data recorded in the data record unit.

In addition, the deterioration characteristic calculation unit may calculate the deterioration characteristic line using the least square method, on the basis of the plurality of pieces of data recorded in the data record unit.

In addition, the capacitor capacity measurement unit may measure the capacity of the smoothing capacitor, on the basis of a DC voltage applied to the smoothing capacitor, and a current inputted to the converter or a current outputted from the converter.

BRIEF DESCRIPTION OF THE DRAWINGS

The present invention will be more clearly understood with reference to the attached drawings.

DETAILED DESCRIPTION

A motor control device having a life prediction unit of a smoothing capacitor will be described below with reference to the attached drawings. However, the present invention is not limited to the drawings or an exemplary embodiment described below.

Figure 1:
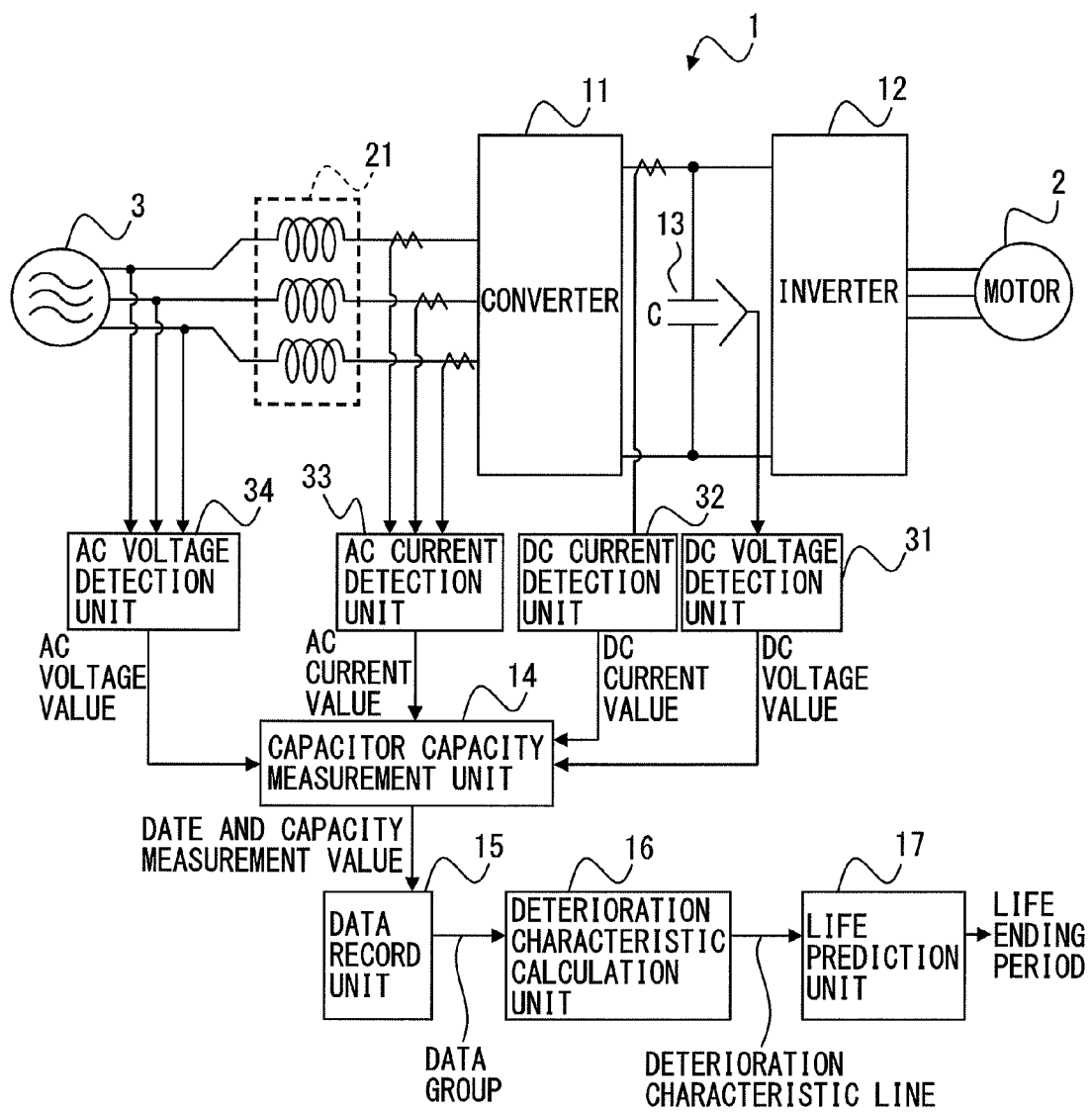
FIG. 1 is a principle block diagram of a motor control device according to an embodiment.

FIG. 1 is a principle block diagram of a motor control device according to an embodiment. Hereinafter, elements denoted by the same reference signs in different drawings mean components having the same function. It is to be noted that, in the embodiment described below, an AC power source 3 is connected on the three-phase AC input side of a motor control device 1, and a three-phase motor 2 is connected on the AC motor side of the motor control device 1. It is to be noted that, although the motor control device 1 that drive-controls one motor 2 is described here, the number of the motors 2 drive-controlled by the motor control device 1 does not particularly limit to the present invention, and a motor control device that drive-controls multiple motors 2 can also be applied. In addition, the type of the motor 2 driven by a motor control device also does not particularly limit to the present invention, and, for example, an induction motor or a synchronous motor may be used.

The motor control device 1 according to the embodiment includes a converter 11, a smoothing capacitor 13, an inverter 12, a capacitor capacity measurement unit 14, a data record unit 15, a deterioration characteristic calculation unit 16, and a life prediction unit 17. In addition, the motor control device 1 includes a DC voltage detection unit 31 for detecting a DC voltage applied to the smoothing capacitor 13, a DC current detection unit 32 for detecting a DC current outputted from the DC output side of the converter 11 or an AC current detection unit 33 for detecting an AC current supplied from the three-phase AC input side of the converter 11, and an AC voltage detection unit 34 for detecting an AC voltage of the AC power source 3. The DC voltage detection unit 31, the DC current detection unit 32 or the AC current detection unit 33, and the AC voltage detection unit 34 are generally included in a motor control device so as to detect a current and a voltage needed to drive-control the motor 2. It is to be noted that, in the embodiment, either the DC current detection unit 32 or the AC current detection unit 33 may be included, but both the current detection unit 32 and the AC current detection unit 33 are illustrated in FIG. 1.

The converter 11 rectifies AC power supplied from the three-phase AC input side on which the commercial AC power source 3 is positioned, and outputs DC power to a DC link positioned on the DC output side of the converter 11. In the present invention, the exemplary embodiment of the converter 11 to be used is not particularly limited, and examples thereof include a diode rectifier circuit and a PWM control system rectifier circuit having a switching element therein. An AC reactor 21 is connected on the three-phase AC input side of the converter 11.

The converter 11 and the inverter 12 are connected through the DC link. The inverter 12 can perform bidirectional power conversion between the DC power in the DC link and AC power that is driving power or regenerative power of the motor 2. The inverter 12 is configured as a conversion circuit having a switching element therein, such as a PWM inverter. The inverter 12 makes the internal switching element perform switching operation on the basis of a motor driving command received from a host control device (not illustrated in the drawing) and converts DC power supplied from the DC link side into three-phase AC power having a desired voltage and a desired frequency for driving the motor 2. The motor 2 is to operate on the basis of the supplied voltage-variable and frequency-variable three-phase AC power. In addition, regenerative power is generated when the motor 2 is braked, and the inverter 12 converts AC power that is the regenerative power generated in the motor 2 into DC power to return the DC power to the DC link, on the basis of the motor driving command received from the host control device. It is to be noted that, when the motor control device 1 drive-controls multiple motors 2, the same number of the inverters 12 as the number of the motors 2 are connected in parallel so as to separately supply driving power to each motor 2 and drive-control the motor 2.

The smoothing capacitor 13 is provided in the DC link that connects the DC side of the converter 11 to the DC side of the inverter 12. The smoothing capacitor 13 has both a function of suppressing pulsation of DC output of the converter 11 or the inverter 12 and a function of temporarily storing DC power outputted from the converter 11 or the inverter 12. The smoothing capacitor 13 is initially charged with DC power outputted from the converter 11 by an initial charging unit (not illustrated in the drawing) between after power activation of the motor control device 1 and before control for driving the motor 2 is actually started. It is to be noted that, although an example in which one inverter 12 is provided is illustrated in FIG. 1, when multiple inverters 12 are connected in parallel, for example, the smoothing capacitors 13 are provided on the DC input side of the respective inverters 12, and therefore, the smoothing capacitors 13 also have a relationship in which the smoothing capacitors 13 are connected to each other in parallel.

In the present embodiment, the capacitor capacity measurement unit 14 measures the capacity of the smoothing capacitor 13, on the basis of a DC voltage applied to the smoothing capacitor 13, and a current inputted to the converter 11 or a current outputted from the converter 11. Here, as a method for measuring the capacity of the smoothing capacitor 13 by the capacitor capacity measurement unit 14, two specific examples are described.

The first specific example is to measure the capacity C of the smoothing capacitor 13 on the basis of the quantity of charge that flows into the smoothing capacitor 13 during the initial charge.

As described above, the smoothing capacitor 13 is initially charged with DC power outputted from the converter 11 by an initial charging unit (not illustrated in the drawing) between after power activation of the motor control device 1 and before control for driving the motor 2 is actually started. When the capacity of the smoothing capacitor 13 is C and the DC voltage applied to the smoothing capacitor 13 at a point before the initial charging operation by the initial charging unit is started, which is detected by the DC voltage detection unit 31, is $V_0$, the quantity $Q_0$ of remaining charge that has been stored in the smoothing capacitor 13 before the initial charging operation is started can be represented by expression 1.

$$Q_0 = CV_0 \qquad (1)$$

The quantity $Q_1$ of charge that is stored in the smoothing capacitor 13 at a point after the initial charging operation by the initial charging unit is completed can be represented by expression 2 when the DC voltage applied to the smoothing capacitor 13 at a point after the initial charging operation is completed, which is detected by the DC voltage detection unit 31, is $V_1$.

$$Q_1 = CV_1 \qquad (2)$$

The quantity of charge that is stored in the smoothing capacitor 13 is increased by $\Delta Q$ as represented in expression 3, due to the initial charging operation by the initial charging unit.

$$\Delta Q = Q_1 - Q_0 \qquad (3)$$

The increase $\Delta Q$ of the charge quantity represented by expression 3 is generated because a current I outputted from the converter 11 during the initial charge, which is detected by the DC current detection unit 32, flows into the smoothing capacitor 13, and thus, expression 4 is satisfied.

$$\Delta Q = Q_1 - Q_0 = \int I dt \qquad (4)$$

Further, equation 5 can be derived by substituting equations 1 and 2 into equation 4 as follows:

$$C = \frac{\int I dt}{V_1 - V_0} \qquad (5)$$

Thus, the capacitor capacity measurement unit 14 measures the capacity of the smoothing capacitor 13 on the basis of expression 5, using the DC voltage $V_0$ applied to the smoothing capacitor 13 at a point before the initial charging operation is started, which is detected by the DC voltage detection unit 31, the DC voltage $V_1$ applied to the smoothing capacitor 13 at a point after the initial charging operation is completed, which is detected by the DC voltage detection unit 31, and the current I outputted from the converter 11 during the initial charge, which is detected by the DC current detection unit 32. It is to be noted that, as an alternative example thereof, an AC current supplied from the three-phase AC input side of the converter 11, which is detected by the AC current detection unit 33, may be used as the current I used in expression 4 and expression 5. However, in this case, the measurement value C of the capacity of the smoothing capacitor 13 includes an error due to a loss of the converter 11, and thus, although the details will be described below, it is preferable that "deterioration determination level" be set as a ratio with respect to the capacity of the smoothing capacitor 13 at a point when the usage of the smoothing capacitor 13 is first started.

The second specific example is, when the converter 11 is a PWM control system rectifier circuit, to measure the capacity C of the smoothing capacitor 13 on the basis of the quantity of stored energy change of the smoothing capacitor 13 before and after initial boosting operation executed after the initial charge of the smoothing capacitor.

Generally, when the converter 11 is a PWM control system rectifier circuit having a switching element therein, a DC voltage having a value equal to or more than the peak value of the AC voltage of the AC power source 3 needs to be outputted in principle. Thus, after the initial charging operation with respect to the smoothing capacitor 13 is completed, switching operation of the switching element in the converter 11 is performed, and "initial boosting operation" for boosting the DC voltage at both ends of the smoothing capacitor 13 to a voltage larger than the peak value of the AC voltage on the side of the AC power source 3 is performed. After the initial charging operation and the initial boosting operation are completed, the inverter 12 starts power conversion operation to shift into a normal operation mode in which driving power is supplied to the motor 2, so that the motor 2 drives on the basis of the AC driving power outputted from the inverter 12. When the electric power energy outputted from the converter 11 is P, the DC voltage applied to the smoothing capacitor 13 at a point after the initial charging of the smoothing capacitor 13 is completed and before the initial boosting is started, which is detected by the DC voltage detection unit 31, is $V_1$, and the DC voltage applied to the smoothing capacitor 13 at a point after the initial boosting of the smoothing capacitor 13 is completed and before the driving of the motor 2 is started, which is detected by the DC voltage detection unit 31, is $V_2$, a relational expression of expression 6 is satisfied as a change of stored energy of the smoothing capacitor 13 before and after the initial boosting operation executed after the initial charge of the smoothing capacitor. It is to be noted that the electric power energy P may be obtained as the product of the DC voltage applied to the smoothing capacitor 13, which is detected by the DC voltage detection unit 31, and the DC current outputted from the DC output side of the converter 11, which is detected by the DC current detection unit 32.

$$\tfrac{1}{2}CV_2^2 - \tfrac{1}{2}CV_1^2 = \Sigma P \Delta t \tag{6}$$

By deforming expression 6, expression 7 is obtained.

$$C = \frac{2 \times \sum P \Delta t}{V_2^2 - V_1^2} \tag{7}$$

Thus, the capacitor capacity measurement unit 14 measures the capacity C of the smoothing capacitor 13 on the basis of expression 7, using the DC voltage $V_1$ applied to the smoothing capacitor 13 at a point after the initial charging is completed and before the initial boosting is started, which is detected by the DC voltage detection unit 31, the DC voltage $V_2$ applied to the smoothing capacitor 13 at a point after the initial boosting is completed and before the driving of the motor 2 is started, which is detected by the DC voltage detection unit 31, and the electric power energy P outputted from the converter 11. It is to be noted that, as an alternative example thereof, the product of the AC current supplied from the three-phase AC input side of the converter 11, which is detected by the AC current detection unit 33, and the AC voltage detected by the AC voltage detection unit 34 may be used as the electric power energy P used in expression 6 and expression 7. However, in this case, the measurement value C of the capacity of the smoothing capacitor 13 includes an error due to a loss of the converter 11, and thus, although the details will be described below, it is preferable that "deterioration determination level" be set as a ratio with respect to the capacity of the smoothing capacitor 13 at a point when the usage of the smoothing capacitor 13 is first started.

The above-described measurement of the capacity of the smoothing capacitor 13 by the capacitor capacity measurement unit 14 is performed multiple times on different days, and may be performed regularly or may be performed irregularly. For example, the measurement of the capacity of the smoothing capacitor 13 may be performed every power activation of the motor control device 1, may be performed every several times of power activation, or may be performed when the motor control device 1 receives a measuring command that a worker inputs via a user interface, such as a control board and a personal computer.

The data record unit 15 records a plurality of pieces of data composed of the measurement value C of the capacity of the smoothing capacitor 13 measured by the capacitor capacity measurement unit 14 and "date" or "both date and time" when the measurement has been performed. "Date" means year, month, and day, and "both date and time" means inclusion of year, month, and day, and time. Hereinafter, in the present description, in order to simplify the explanation, the term "day and time" is used as the meaning of "only date" or the meating of "both date and time".

The deterioration characteristic calculation unit 16 calculates a deterioration characteristic line indicating a change of the capacity of the smoothing capacitor 13 with respect to elapsed time, on the basis of the plurality of pieces of data recorded in the data record unit 15. The deterioration characteristic line indicates the capacity of the smoothing capacitor by an n-th degree function expression (where n is a natural number) when the day and time is an independent variable, and is expressed on a planar coordinate system in which one axis (for example, X-axis) indicates the day and time and the other axis (for example, Y-axis) indicates the capacity of the smoothing capacitor 13. Since the smoothing capacitor 13 deteriorates due to repetition of charge and discharge and its capacity is reduced, the deterioration characteristic line shows a tendency in which the capacity of the smoothing capacitor 13 is reduced as days pass.

Figure 2:
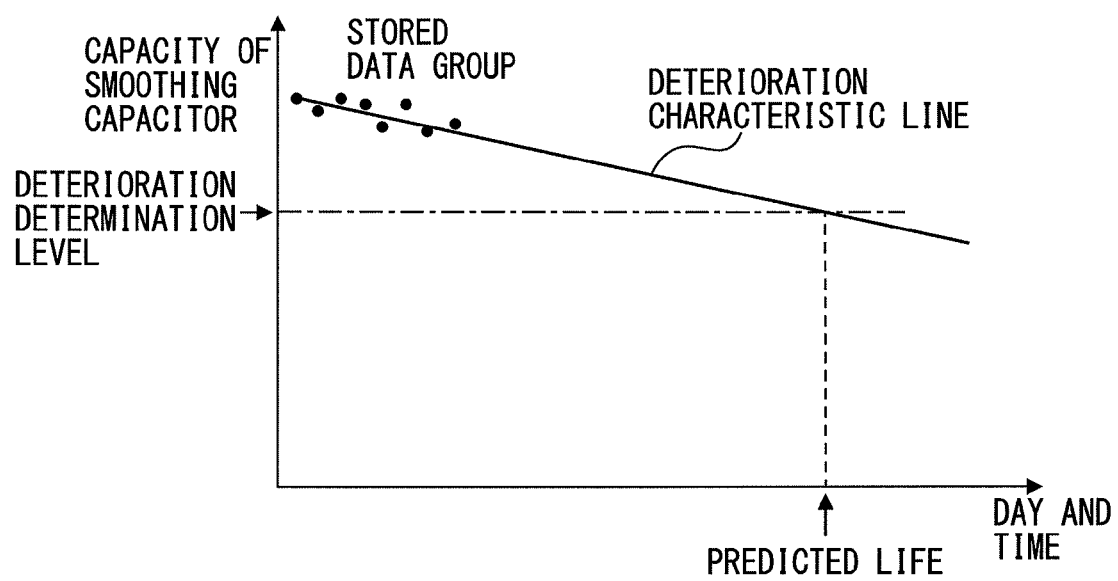
FIG. 2 is a diagram illustrating an example of a deterioration characteristic line.

For example, the degree of the n-th degree function expression is preset by a worker, and the coefficient of the n-th degree function expression is calculated by the deterioration characteristic calculation unit 16 using the least square method, on the basis of the plurality of pieces of data recorded in the data record unit 15. FIG. 2 is a diagram illustrating an example of the deterioration characteristic line. In the illustrated example, the pieces of data (eight pieces of data in the illustrated example) composed of the measurement value C of the capacity of the smoothing capacitor 13 and the day and time when the measurement has been performed, which are recorded in the data record unit 15, are represented by black circles, and the deterioration characteristic line (represented by the solid line in the drawing) is a linear function expression as an example.

Alternatively, by simplifying the calculation processing of the deterioration characteristic line by the deterioration characteristic calculation unit 16, the deterioration characteristic line expressed by a linear function expression may be calculated on the basis of a measurement result of the capacity of the smoothing capacitor 13 at two points. For example, the deterioration characteristic line expressed by a linear function expression may be calculated by performing a linear approximation using data composed of the measurement value of the capacity of the smoothing capacitor 13 at a point when the usage of the smoothing capacitor 13 is first started and the day and time of that time, and data composed of the measurement value of the capacity of the smoothing capacitor 13 at a point when some days, months, or years have passed since the point when the usage is first started and the day and time of that time.

The life prediction unit 17 predicts a period when a life of the smoothing capacitor ends, on the basis of the deterioration characteristic line calculated by the deterioration characteristic calculation unit 16. Specifically, on the planar coordinate system in which one axis (for example, X-axis) indicates the day and time and the other axis (for example, Y-axis) indicates the capacity of the smoothing capacitor 13, the life prediction unit 17 calculates an intersection of the deterioration characteristic line represented by the n-th degree function expression and a preset deterioration determination level by solving an n-th degree equation, and determines a coordinate of the intersection, which indicates the day and time, as the period when the life of the smoothing capacitor ends. It is to be noted that the deterioration determination level is represented by the dot-and-dash line in the example illustrated in FIG. 2. The life ending period predicted by the life prediction unit 17 is displayed on, for example, a display of a control board or a display of a mobile terminal or a personal computer, which is provided in the motor control device 1, by letters and pictures to be made known to a worker. Alternatively, the predicted life ending period may be made known to a worker by sound through a speaker. Alternatively, the predicted life ending period may be stored in a recording device such that the predicted life ending period can be displayed on a display or outputted by sound from a speaker at a later date.

It is to be noted that "deterioration determination level" used for the life prediction by the life prediction unit 17 may be set as follows. More specifically, as the capacity of the smoothing capacitor 13 is reduced due to the repetition of charge and discharge, the fluctuation of the DC voltage of the DC link in the motor control device 1 is large and the quantity of energy that can be stored is reduced to get close to a region not capable of functioning normally as the motor control device 1. The capacity of the smoothing capacitor 13, which ensures normal operation of the motor control device 1, or a value larger than the capacity is set as "deterioration determination level". It is to be noted that the deterioration determination level may be set as the size of the capacity (unit: farad), or may be set as a ratio with respect to the capacity of the smoothing capacitor 13 at a point when the usage of the smoothing capacitor 13 is first started. When the deterioration determination level is set as a ratio with respect to the capacity of the smoothing capacitor 13 at a point when the usage of the smoothing capacitor 13 is first started, the deterioration characteristic line calculated by the deterioration characteristic calculation unit 16 is preferably standardized by the measurement value C of the capacity of the smoothing capacitor, which is measured first. In particular, when the capacity of the smoothing capacitor 13 is measured using the AC current supplied from the three-phase AC input side of the converter 11, which is detected by the AC current detection unit 33, it is preferable that the deterioration determination level be set as a ratio with respect to the capacity of the smoothing capacitor 13 at a point when the usage of the smoothing capacitor 13 is first started.

In addition, the above-described capacitor capacity measurement unit 14, data record unit 15, deterioration characteristic calculation unit 16, and life prediction unit 17 may be structured by a software program form, for example, or may be structured by a combination of various electronic circuits and a software program. For example, when these units and circuits are structured by a software program form, an arithmetic processing unit in the motor control device 1 is made to operate in accordance with the software program, so that the functions of the above-described respective parts are achieved. In addition, since the period when the life of the smoothing capacitor ends is predicted by using the DC current and the DC voltage detected by the DC voltage detection unit 31 and the DC current detection unit 32 that the motor control device originally includes for drive-controlling the motor, a new detection unit for life prediction needs not to be provided, and thus, application to an existing motor control device later is also possible. In this case, the software program according to the above-described capacitor capacity measurement unit 14, data record unit 15, deterioration characteristic calculation unit 16, and life prediction unit 17 may be additionally installed in an arithmetic processing unit in the existing motor control device.

In this manner, according to the present invention, the period when the life of the smoothing capacitor 13 ends in the case where the present usage state is continued can be predicted not just before but before the end of the life by a mid-and-long period. Therefore, it is easy to make a flexible response, for example, to review an operating condition of the motor control device, on the basis of the life prediction of the smoothing capacitor, and furthermore, it is easy to create an efficient replacement plan of the smoothing capacitor for the life of the smoothing capacitor, which ends in the future.

Figure 3:
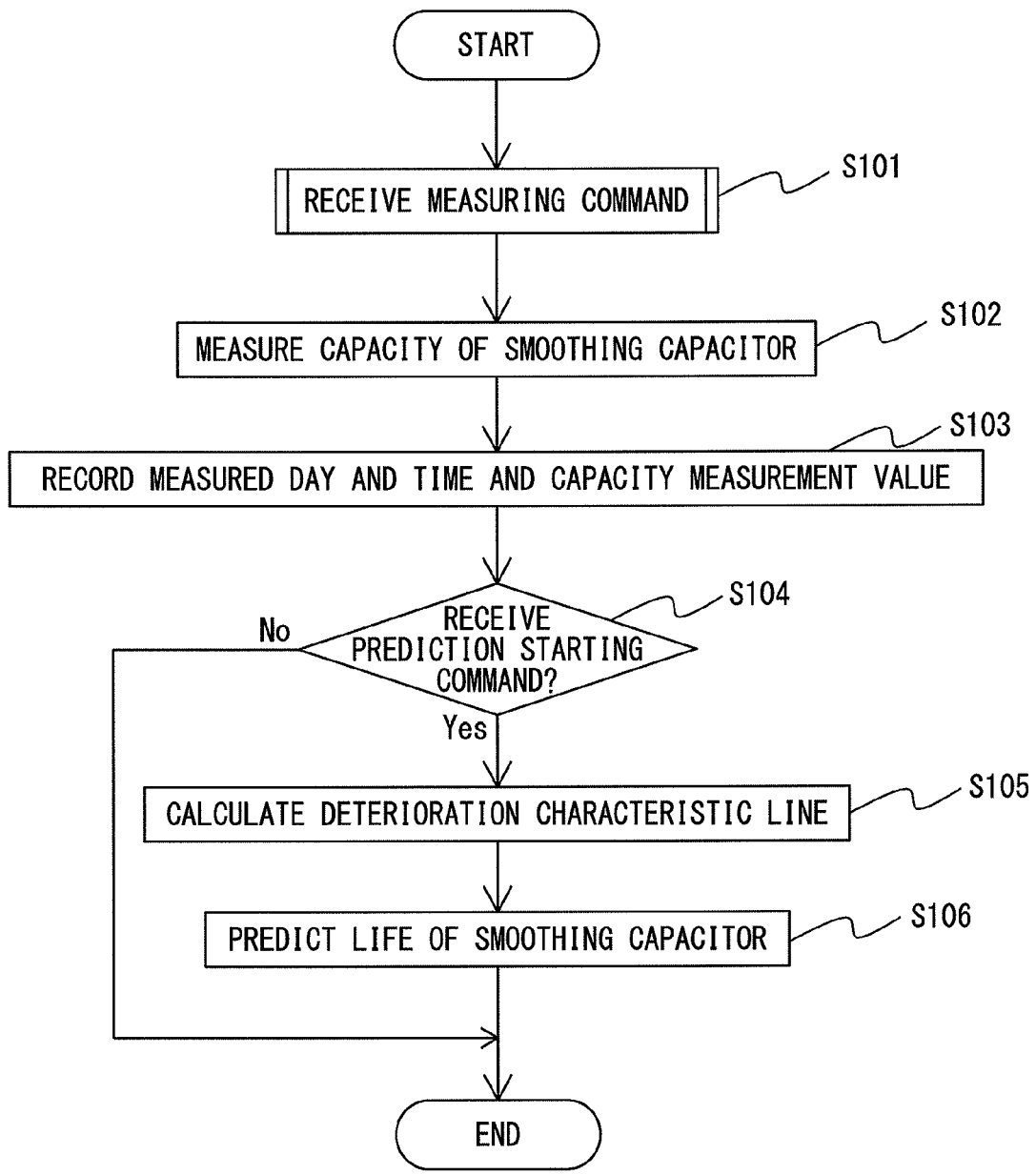
FIG. 3 is a flow chart illustrating an operation flow of life prediction processing of a smoothing capacitor in the motor control device according to the embodiment.
Figure 4:
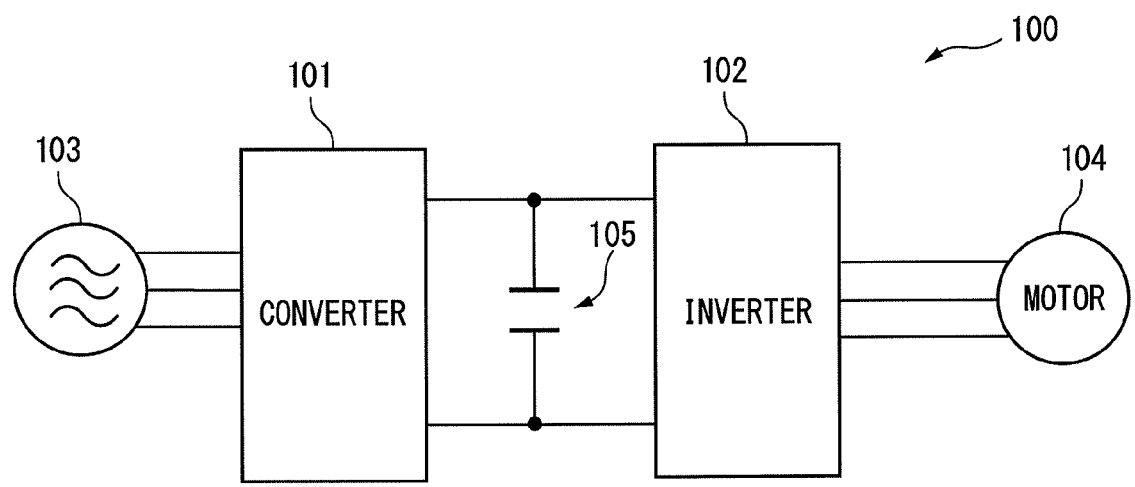
FIG. 4 is a diagram illustrating a configuration of a general motor control device.

FIG. 3 is a flow chart illustrating an operation flow of life prediction processing of the smoothing capacitor in the motor control device according to the embodiment. The life prediction processing of the smoothing capacitor is executed before the motor control device 1 is powered on to actually start control for driving the motor 2.

As described above, the measurement of the capacity of the smoothing capacitor 13 by the capacitor capacity measurement unit 14 is performed multiple times on different days, and may be performed regularly or may be performed irregularly. For example, the measurement of the capacity of the smoothing capacitor 13 may be performed every power activation of the motor control device 1, may be performed every several times of power activation, or may be performed when the motor control device 1 receives a measuring command that a worker inputs via a user interface, such as a control board and a personal computer. As an example, the case where the measurement of the capacity of the smoothing capacitor 13 by the capacitor capacity measurement unit 14 is started when the motor control device 1 receives a measuring command that a worker inputs (Step S101) is described here.

When the motor control device 1 receives the measuring command in Step S101, the capacitor capacity measurement unit 14 measures the capacity C of the smoothing capacitor 13 in Step S102. When measuring the capacity C of the smoothing capacitor 13 on the basis of the quantity of charge that flows into the smoothing capacitor 13 during the initial charge, the capacitor capacity measurement unit 14 measures the capacity of the smoothing capacitor 13 on the basis of expression 5, using the DC voltage $V_0$ applied to the smoothing capacitor 13 at a point before the initial charging operation is started, which is detected by the DC voltage detection unit 31, the DC voltage $V_1$ applied to the smoothing capacitor 13 at a point after the initial charging operation is completed, which is detected by the DC voltage detection unit 31, and the current I outputted from the converter 11 during the initial charge, which is detected by the DC current detection unit 32. Alternatively, when measuring the capacity C of the smoothing capacitor 13 on the basis of the quantity of stored energy change of the smoothing capacitor 13 before and after initial boosting operation executed after the initial charge of the smoothing capacitor, the capacitor capacity measurement unit 14 measures the capacity of the smoothing capacitor 13 on the basis of expression 7, using the DC voltage $V_1$ applied to the smoothing capacitor 13 at a point after the initial charging is completed and before the initial boosting is started, which is detected by the DC voltage detection unit 31, the DC voltage $V_2$ applied to the smoothing capacitor 13 at a point after the initial boosting is completed and before the driving of the motor 2 is started, which is detected by the DC voltage detection unit 31, and the electric power energy P outputted from the converter 11.

Next, the data record unit 15 records data composed of the measurement value C of the capacity of the smoothing capacitor 13 measured by the capacitor capacity measurement unit 14 and the day and time when the measurement has been performed in Step S103.

Next, the motor control device 1 determines whether to receive a prediction starting command in Step S104. The prediction starting command is inputted by a worker via a user interface, such as a control board and a personal computer.

When it is determined that the prediction starting command has not been received in Step S104, the processing is terminated. In this case, only the measurement processing of the capacity of the smoothing capacitor 13 by the capacitor capacity measurement unit 14 and the record processing of the data composed of the measurement value C of the capacity of the smoothing capacitor 13 and the day and time when the measurement has been performed by the data record unit 15 are executed, and the data is only stored. By repeating the processing of Steps S101 to S103 multiple times, a plurality of pieces of the data composed of the measurement value C of the capacity of the smoothing capacitor 13 and the day and time when the measurement has been performed can be obtained.

When it is determined that the prediction starting command has been received in Step S104, the processing proceeds to Step S105. The deterioration characteristic calculation unit 16 calculates the deterioration characteristic line indicating a change of the capacity of the smoothing capacitor 13 with respect to elapsed time, on the basis of the plurality of pieces of the data recorded in the data record unit 15, in Step S105.

Next, the life prediction unit 17 predicts the period when the life of the smoothing capacitor ends, on the basis of the deterioration characteristic line calculated by the deterioration characteristic calculation unit 16 in Step S106. The predicted life ending period is displayed on, for example, a display of a control board or a display of a mobile terminal or a personal computer, which is provided in the motor control device 1, by letters and pictures to be made known to a worker. Alternatively, the predicted life ending period is made known to a worker by sound through a speaker.

According to the present invention, the motor control device that can correctly predict the life of the smoothing capacitor in the DC link between the converter and the inverter can be achieved. Since the period when the life of the smoothing capacitor ends in the case where the present usage state is continued can be predicted not just before but before the end of the life by a mid-and-long period, it is easy to make a flexible response, for example, to review an operating condition of the motor control device, on the basis of the life prediction of the smoothing capacitor, and furthermore, it is easy to create an efficient replacement plan of the smoothing capacitor for the life of the smoothing capacitor, which ends in the future. In addition, since the period when the life of the smoothing capacitor ends can be predicted by using the current and the voltage detected by the current detection unit and the voltage detection unit that the motor control device originally needs for drive-controlling the motor, a new detection unit for life prediction needs not to be provided. Therefore, application to an existing motor control device later is also easy. In addition, the discharge unit in the invention described in Japanese Unexamined Patent Publication No. 8-80055 and the leakage current measurement unit in the invention described in Japanese Unexamined Patent Publication No. 2007-318872 need not to be provided separately.

What is claimed is:

1. A motor control device comprising:
    a converter that converts AC power supplied from a side of an AC power source into DC power;
    a smoothing capacitor provided in a DC link on a DC side of the converter;
    an inverter that performs mutual power conversion between the DC power in the DC link and AC power that is driving power or regenerative power of a motor;
    a capacitor capacity measurement unit that measures a capacity of the smoothing capacitor, on the basis of the DC voltage applied to the smoothing capacitor at a point after an initial charging operation is complete;
    a data record unit that records a plurality of pieces of data composed of a measurement value of the capacity of the smoothing capacitor measured by the capacitor capacity measurement unit and a date or both a date and time when the measurement has been performed;
    a deterioration characteristic calculation unit that calculates a deterioration characteristic line indicating a change of the capacity of the smoothing capacitor with respect to elapsed time, on the basis of the plurality of pieces of data recorded in the data record unit; and
    a life prediction unit that predicts a period when a life of the smoothing capacitor ends, on the basis of the deterioration characteristic line calculated by the deterioration characteristic calculation unit.

2. The motor control device according to claim 1, wherein the life prediction unit calculates a date or both a date and time when the deterioration characteristic line is a predetermined deterioration determination level or less, and determines the date or both the date and time as the period when the life of the smoothing capacitor ends.

3. The motor control device according to claim 2, wherein the deterioration characteristic calculation unit calculates the deterioration characteristic line as an n-th degree function expression, where n is a natural number, on the basis of the plurality of pieces of data recorded in the data record unit.

4. The motor control device according to claim 3, wherein the deterioration characteristic calculation unit calculates the deterioration characteristic line using the least square method, on the basis of the plurality of pieces of data recorded in the data record unit.

5. The motor control device according to claim 4, wherein the capacitor capacity measurement unit measures the capacity of the smoothing capacitor, on the basis of a DC voltage applied to the smoothing capacitor, and a current inputted to the converter or a current outputted from the converter.

* * * * *